United States Patent [19]

Hattori et al.

[11] Patent Number: 5,043,044
[45] Date of Patent: Aug. 27, 1991

[54] MONOCRYSTALLINE SILICON WAFER

[75] Inventors: Junichi Hattori; Koichiro Takahata, both of Tokyo, Japan

[73] Assignee: NEC Corporation, Tokyo, Japan

[21] Appl. No.: 212,078

[22] Filed: Jun. 28, 1988

Related U.S. Application Data

[63] Continuation of Ser. No. 787,418, Oct. 15, 1985, abandoned.

[30] Foreign Application Priority Data

Oct. 15, 1984 [JP] Japan ................................ 59-215604

[51] Int. Cl.$^5$ .............................................. C03C 15/00
[52] U.S. Cl. ..................................... 156/645; 156/662
[58] Field of Search ...................... 156/645, 662; 65/31

[56] References Cited

U.S. PATENT DOCUMENTS

| | | | |
|---|---|---|---|
| 2,845,374 | 7/1958 | Jones | 148/33.2 |
| 4,094,731 | 6/1978 | Keyser et al. | 164/122.2 |
| 4,175,610 | 11/1979 | Zauhar et al. | 164/122.2 |
| 4,180,119 | 12/1979 | Burd et al. | 164/122.2 |
| 4,225,378 | 9/1980 | Garrison | 164/122.2 |
| 4,330,582 | 5/1982 | Lindmayer | 423/348 |
| 4,371,421 | 2/1983 | Fan et al. | 156/624 |
| 4,382,838 | 5/1983 | Authier | 164/122.2 |
| 4,561,486 | 12/1985 | Maeda et al. | 156/616 R |
| 4,579,080 | 4/1986 | Martin et al. | 118/724 |
| 4,608,096 | 8/1986 | Hill | 156/D66 |

OTHER PUBLICATIONS

Wolf et al., Silicon Processing for the VSLI Era; vol. I, Lattice Press, Sunset Beach, Calif. 1986, pp. 23–30.
Zulehner et al., Crystals, Growth Properties and Applications, Springer-Verlag, N.Y., 1982, pp. 104–107.
Moore et al., Worldwide Wafer Standardization-Factor Fancy?, Solid State Technology, Feb. 1975, pp. 40–43.
Zulehner et al., Czochralski-Grown Silicon, in Crystals, vol. 8, Freyhardt, editor, Springer-Verlag, New York, 1982, pp. 104 to 107.
W. R. Runyan, "Silicon Semiconductor Technology", pp. 17–28, McGraw-Hill Book Company, 1965.

*Primary Examiner*—David A. Simmons
*Assistant Examiner*—Thi Dang
*Attorney, Agent, or Firm*—Sughrue, Mion, Zinn, MacPeak & Seas

[57] ABSTRACT

A silicon wafer in which a plurality of semiconductor devices are to be formed is disclosed. The silicon wafer has a convex front surface before a process step for forming the semiconductor devices is conducted. The shape of the convex is designed such that during process steps to form and to complete the semiconductor devices in the silicon wafer, the shape of the front surface usually maintains convex conditions without changing to a concave condition.

6 Claims, 3 Drawing Sheets

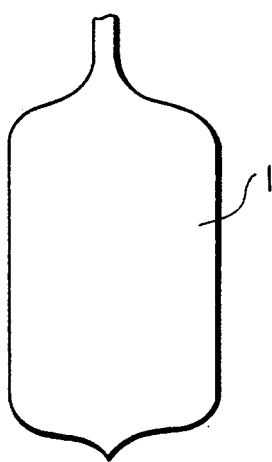
FIG 1
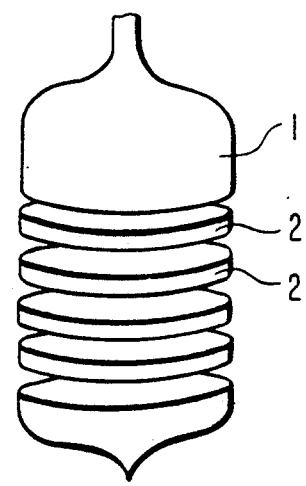
FIG 2
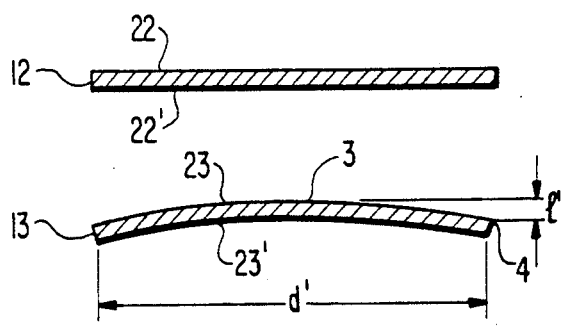
FIG 3A PRIOR ART
FIG 3B PRIOR ART
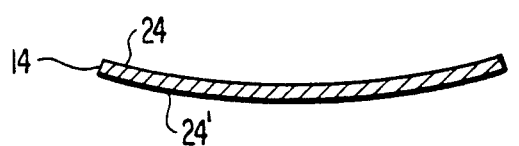
FIG 3C PRIOR ART
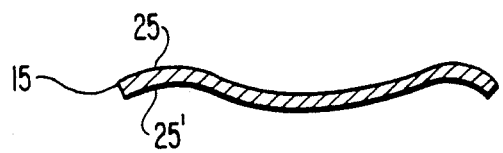
FIG 3D PRIOR ART
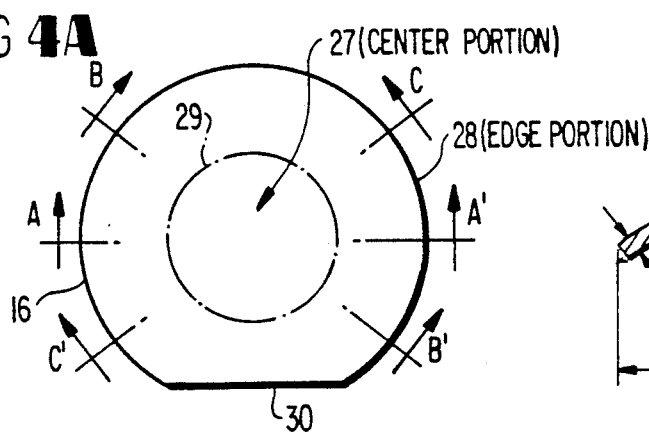
FIG 4A
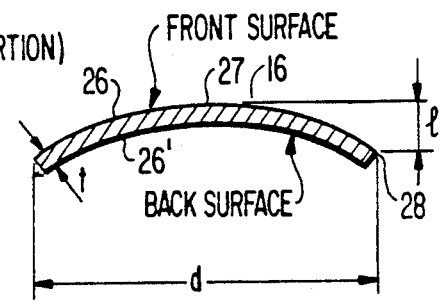
FIG 4B

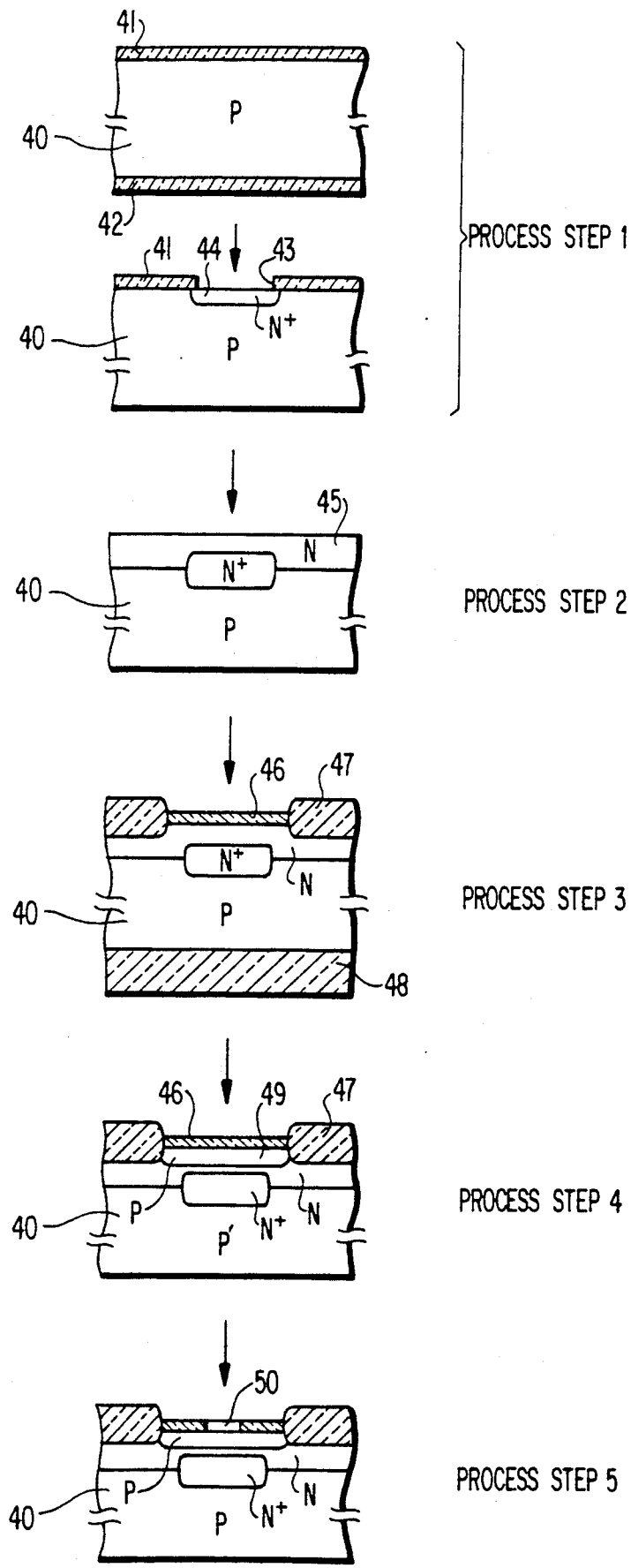

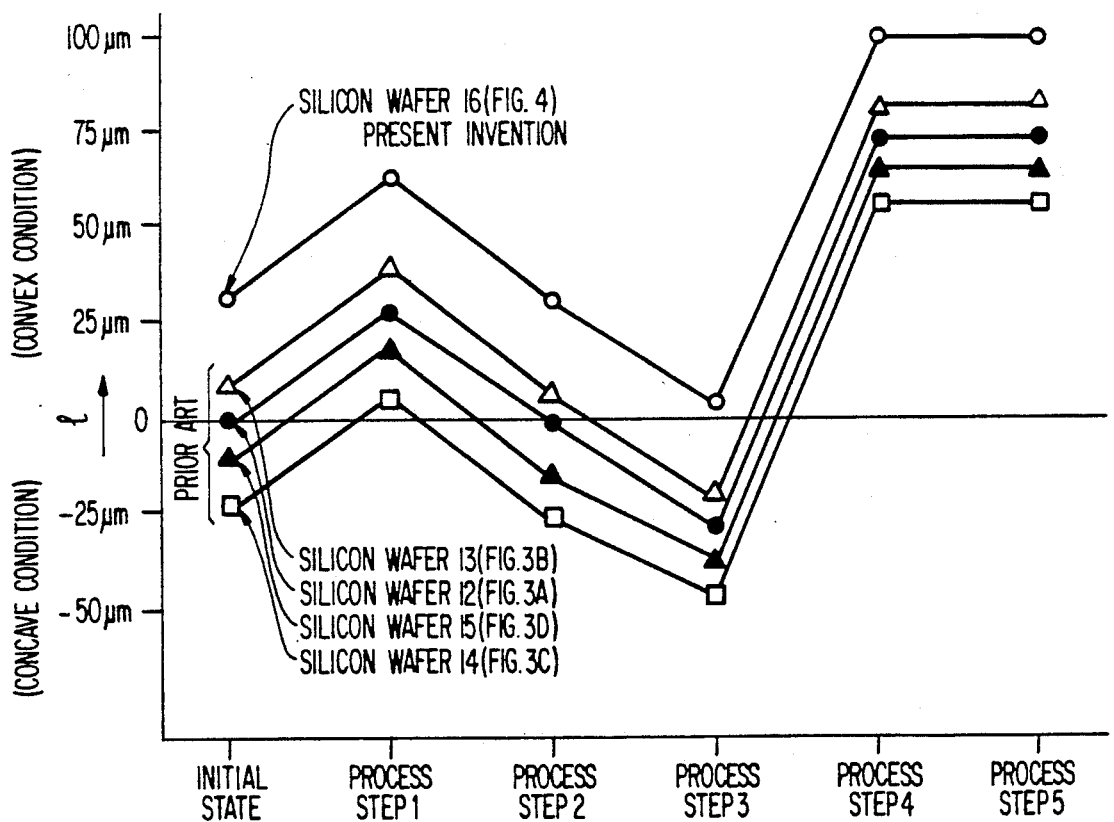

MONOCRYSTALLINE SILICON WAFER

This is a continuation of application Ser. No. 787,418, filed 10/15/85, now abandoned. cBACKGROUND OF THE INVENTION The present invention relates to a monocrystalline silicon wafer (hereinafter abbreviated as silicon wafer), and more particularly to a silicon wafer for subsequent use in performing process steps for forming semiconductor devices.

Heretofore, a silicon wafer has been manufactured by slicing a silicon ingot produced by well known CZ method or FZ method, and conducting lapping, etching and polishing on the front surface in which semiconductor elements are to be formed.

In the prior art, the silicon wafer is manufactured such that its front and back surfaces are co-planar. However, in the various process steps of manufacturing semiconductor devices in the silicon wafer, the silicon wafer assumes a concave shape in some process steps and a convex shape in other process steps. Therefore, compression stress and tensile stress are repeatedly produced in the front surface of the silicon wafer, particularly in the center portion thereof. Therefore, crystal defects are produced in the front surface and devices formed therein inevitably have bad characteristics. This phenomena is mainly caused by forming an insulating layer such as silicon dioxide layer on the front and back surfaces of the silicon wafer, and then removing it from the surfaces, because the insulating layer has a different thermal expansion coefficient from that of silicon. According to various experiments of the inventors of the present invention, if the tensile stress only is produced without compression stress in the front surface of the silicon wafer during process steps of manufacturing semiconductor devices, fatal crystal defects do not occur in the front surface.

SUMMARY OF THE INVENTION

It is, therefore, one object of the present invention to provide a silicon wafer in which generation of fatal crystal defects is suppressed during the fabrication of semiconductor devices therein.

According to one feature of the present invention, there is provided a silicon wafer of a particular shape before subjecting the same to the process steps for forming semiconductor devices therein. The silicon wafer has a convex front surface in which the semiconductor devices are to be formed. In other words, the silicon wafer has a convex shape when the front surface of the wafer faces upwardly, and has a uniform thickness. Favorably, the ratio of the height of the center portion of the front surface over the edge portion of the front surface ranges from $8.0 \times 10^7$ $1.3 \times 10^4$ $8.0 \times 10^{-4}$ to $8.0 \times 10^{-7}$ to the diameter of the wafer. For example, the height ranges from 20 $\mu$m to 60 $\mu$m when the diameter of the wafer ranges from 75 mm to 150 mm.

BRIEF DESCRIPTION OF DRAWINGS

FIG. 1 shows a perspective view of a silicon ingot;

FIG. 2 shows a perspective view of slicing the silicon ingot;

FIGS. 3A to 3D show cross-sectional views of silicon wafers in the prior art, respectively;

FIGS. 4A and 4B show an embodiment of the present invention; FIG. 4A is a plan view and FIG. 4B is a cross-sectional view taken along lines A—A', B—B' and C—C' in FIG. 4A as viewed in the direction of the arrows, respectively;

FIG. 5 is a series of cross-sectional views showing partial process steps for forming semiconductor devices in the silicon wafer; and FIG. 6 is a diagram showing the curvature conditions of silicon wafers of an embodiment of the present invention and those of the prior art during the process steps in FIG. 5.

EXPLANATION OF THE EMBODIMENT

Referring to FIGS. 1 and 2, a silicon ingot 1 is produced by a CZ method and an FZ method, and is sliced to obtain silicon wafers 2. Thereafter, each of the front surfaces of the silicon wafers is subjected to lapping, etching and polishing. Silicon wafers in the prior art are shown in FIGS. 3A to 3D.

The silicon wafer 12 in FIG. 3A has a flat front surface 22 and a flat back surface 22' with uniform thickness. In FIG. 3B, the silicon wafer 13 has a front surface 23 having a small convex shape and a back surface 23' having a small concave shape. However, in the prior art, the height $l'$ of the center portion 3 of the front surface 23 over the edge portion 4 of the front surface 23 $0.8 \times 10^{-4}$ or less of the diameter $d'$ of the wafer 13. For example, if the diameter $d'$ of the wafer is 127 mm, the height $l'$ is 10 $\mu$m or less. The silicon wafer 14 in FIG. 3C has a front surface 24 of a concave shape and a back surface 24' of convex shape with a uniform thickness. In FIG. 3D, the silicon wafer 15 has wave-like front and back surfaces 25, 25' with a uniform thickness therebetween. These silicon wafers change the shapes during manufacturing semiconductor devices from the concave shape to the convex shape and from convex to concave, repeatedly. Therefore, fatal crystal defects in the front surface occur, and the production yield of semiconductor devices formed in the front surface is decreased.

Referring to FIGS. 4A and 4B, the front major surface 26 of the silicon wafer 16 according the embodiment of the present invention has a large convex shape, and a back major surface 26' thereof has a large concave shape. The thickness t between the front and back surfaces is substantially uniform over the whole of the wafer. More particularly, the ratio of the height l of the center portion 27 of the front surface 26 over the edge portion 28 of the front surface 26 to the diameter d of the wafer 16 ranges from $1.3 \times 10^{-4}$ to $8.0 \times 10^{-4}$. For example, the height l of the center portion 27 over the edge portion 28 ranges from 20 $\mu$m to 60 $\mu$m when the diameter d of the wafer ranges from 75 mm to 150 mm. The front surface has a substantially symmetrical shape with respect to the center portion 27, that is, the top portion, except for the orientation flat (OF) 30. Namely, portions positioned in the same concentric circles 29 (indicated by the phantom line In FIG. 4A) with respect to the center portion 27 substantially maintain the same height level as each other. According to the present invention, the silicon wafer maintains its convex condition during all process steps for forming semiconductor devices in the front surface. Namely, the convex condition is not changed to concave. Therefore, fatal crystal defects which influence the characteristics of semiconductor devices are not produced in the front surface and a high production yield of semiconductor devices can be expected.

Referring to FIGS. 5 and 6, partial process steps and corresponding wafer conditions will be explained. In the starting state, the silicon wafer 16 of the invention, indicated by the white circles in FIG. 6, has a convex condition and a high height l (defined in FIG. 4B) of 30 μm, and the silicon wafer 13 indicated by white triangles has a somewhat convex condition and a small height l' (shown in FIG. 3B) of 10 μm or less. The silicon wafer 12 indicated by black circles has a flat surface. The silicon wafer 15 indicated by black triangles has a wave-like shape and a small concave condition at its center cortion, and the silicon wafer 14 indicated by white squares has a concave condition.

In process step 1, silicon dioxide films 41, 42 are formed on the front and back surfaces of the P-type silicon wafer 40, and thereafter an opening 43 is formed in the silicon dioxide film 41 on the front surface. An N-type impurity is introduced through the opening 43 to form an N+-type buried region 44. When the opening is formed, the silicon dioxide film 42 on the back surface is removed. Therefore, the silicon dioxide film is only provided on the front surface of the wafer. In this step, all of the silicon wafers 12 to 15 maintain convex conditions. Next, in process step 2, the silicon dioxide film 41 is removed and an N-type silicon epitaxial layer 45 is deposited to form a collector region of a bipolar transistor. In this process, no silicon oxide film are provided, and the silicon layer 45 has the same thermal expansion coefficient as that of the silicon wafer. Therefore, all of the silicon wafers are returned to their initial states. Namely, between process steps 1 to 2, silicon wafers 15, 14 change their curvature from convex to concave. Next, in process step 3, a silicon nitride film 46 is selectively formed, and subjected to thermal oxidation to form thick silicon dioxide layers 47, 48. In this case, the silicon dioxide layer 48 is formed on the back surface as well as above the front surface, and therefore, the influence of the silicon dioxide layers is compensated. However, the silicon nitride film 46 is provided above the front surface of the wafer. The thermal expansion coefficient of silicon nitride is larger than that of silicon. Therefore, silicon wafers in curvature toward concave. Namely, between process steps 2 to 3, silicon wafers 13, 12 are converted to concave curvature. Next, in process step 4, the thick silicon layer 48 on the back surface of the silicon wafer is removed and a P-type impurity is implanted through the silicon nitride film 46 to form a P-type impurity region 49, that is, a base region of the bipolar transistor. In this process, the thick silicon oxide layer 48 is removed only from the back surface. Therefore, silicon wafers 13, 12, 15, 14 are converted from concave to convex curvature. Thereafter, in process step 5, an opening 50 is formed in the silicon nitride film to connect an electrode to the P-type impurity region 49. The silicon wafers 12, 13, 14, 15 of the prior art are all inevitably converted from concave to convex curvature and from convex to concave curvature. On the other hand, as shown in FIG. 6, the silicon wafer 16 of the present invention càn maintain its convex condition throughout process steps to form and to complete semiconductor devices on the silicon wafer.

What is claimed is:

1. A method of producing a monocrystalline silicon wafer for semiconductor device fabrication, comprising;
   (a) providing a monocrystalline silicon ingot;
   (b) slicing said ingot to obtain a monocrystalline silicon wafer; and
   (c) lapping, etching and polishing a front surface of said wafer;
   (d) said slicing step (b) and said lapping, etching and polishing step (c) being conducted so as to provide said wafer with a convex front surface and a concave back surface, said wafer having a uniform thickness, the height of a central portion of said convex front surface above an edge portion of said front surface being such that the convexity of said front surface is maintained when semiconductor device fabrication is conducted on said wafer.

2. The method according to claim 1, wherein said slicing, lapping, etching and polishing steps are conducted such that a ratio of the height of the central portion of the convex front surface to the diameter of said silicon wafer is within the range between $1.3 \times 10^{-4}$ and $8.0 \times 10^{-4}$.

3. The method according to claim 2, wherein said slicing, lapping, etching and polishing steps are conducted such that the diameter of said silicon wafer ranges from 75 mm to 150 mm, and the height ranges from 20μm to 60 μm.

4. The method according to claim 1, wherein said semiconductor device fabrication includes the step of:
   forming a film having a a different thermal expansion co-efficient than silicon on the convex front surface of said silicon wafer, and wherein the maintenance of the convexity of the convex front surface during said semiconductor device fabrication prevents a change in curvature of the convex front surface from said film.

5. The method according to claim 4, wherein said film is formed of silicon nitride.

6. A method of producing a monocrystalline silicon wafer for semiconductor device fabrication, comprising the steps of:
   providing a monocrystalline silicon ingot;
   slicing said ingot to obtain a monocrystalline silicon wafer; and
   lapping, etching and polishing a front surface of said wafer;
   said slicing step and said lapping, etching and polishing step being conducted so as to provide said wafer with a convex front surface and a concave back surface, said wafer having a uniform thickness, the convexity of said front surface being maintained when semiconductor device fabrication is conducted on said wafer so that substantially no compression stress is produced in the front surface of the silicon wafer.

* * * * *

UNITED STATES PATENT AND TRADEMARK OFFICE
CERTIFICATE OF CORRECTION

PATENT NO. : 5,043,044

DATED : August 27, 1991

INVENTOR(S) : Junichi HATTORI et al

Page 1 of 2

It is certified that error appears in the above-identified patent and that said Letters Patent is hereby corrected as shown below:

Column 1, line 56, after "surface" insert --to the diameter of the wafer--.

Column 1, line 56 and 57, delete "$8.0 \times 10^7$ $1.3 \times 10^4$ $8.0 \times 10^{-4}$ to $8.0 \times 10^{-7}$ to the diameter of the wafer", insert --$1.3 \times 10^{-4}$ to $8.0 \times 10^{-4}$--.

Column 2, line 24, delete "1'", insert --$\ell'$--.

Column 2, line 28, delete "1'", insert --$\ell'$--.

Column 2, line 46, delete "1", insert --$\ell$--.

Column 2, line 50, delete "1", insert --$\ell$--.

Column 3, line 5, delete "1", insert --$\ell$--.

UNITED STATES PATENT AND TRADEMARK OFFICE
CERTIFICATE OF CORRECTION

PATENT NO. : 5,043,044

DATED : August 27, 1991

INVENTOR(S) : Junichi hattori, et al.

It is certified that error appears in the above-identified patent and that said Letters Patent is hereby corrected as shown below:

Column 3, line 8, delete "1'", insert --$\ell$'--.

Signed and Sealed this

Fourth Day of May, 1993

Attest:

MICHAEL K. KIRK

Attesting Officer

Acting Commissioner of Patents and Trademarks